(12) United States Patent
Yoshino

(10) Patent No.: US 10,497,698 B2
(45) Date of Patent: Dec. 3, 2019

(54) SEMICONDUCTOR CIRCUIT AND SEMICONDUCTOR DEVICE

(71) Applicant: Mitsubishi Electric Corporation, Tokyo (JP)

(72) Inventor: Manabu Yoshino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/090,917

(22) PCT Filed: Jun. 10, 2016

(86) PCT No.: PCT/JP2016/067299
§ 371 (c)(1),
(2) Date: Oct. 3, 2018

(87) PCT Pub. No.: WO2017/212622
PCT Pub. Date: Dec. 14, 2017

(65) Prior Publication Data
US 2019/0109130 A1 Apr. 11, 2019

(51) Int. Cl.
*H01L 29/66* (2006.01)
*H01L 27/06* (2006.01)
(Continued)

(52) U.S. Cl.
CPC ...... *H01L 27/0629* (2013.01); *H01L 21/8234* (2013.01); *H01L 23/5286* (2013.01);
(Continued)

(58) Field of Classification Search
CPC . H01L 27/062; H01L 27/0629; H01L 27/088; H01L 29/0649; H01L 29/0692; H01L 29/7817
See application file for complete search history.

(56) References Cited

U.S. PATENT DOCUMENTS 5,455,439 A 10/1995 Terashima et al.
7,239,181 B2 7/2007 Himi et al.
(Continued)

FOREIGN PATENT DOCUMENTS

JP 2739004 B2 4/1998
JP 2000-294803 A 10/2000
(Continued)

OTHER PUBLICATIONS

International Search Report issued in PCT/JP2016/067299; dated Sep. 6, 2016.
(Continued)

*Primary Examiner* — Phuc T Dang
(74) *Attorney, Agent, or Firm* — Studebaker & Brackett PC

(57) ABSTRACT

An object is to provide a technique for enhancing the breakdown voltage of a semiconductor device. A semiconductor circuit includes a first resistor, a second resistor, a third resistor, a MOSFET, and an inverter. The first resistor, the second resistor, and the third resistor are connected in series between a power supply and a ground corresponding to the reference voltage of a low-side circuit. The MOSFET is connected to the third resistor in parallel between the second resistor and the ground, and has a gate electrically connected to the low-side circuit. The inverter is electrically connected between a connection point and the high-side circuit, the connection point being located between the first resistor and the second resistor.

8 Claims, 15 Drawing Sheets

(51) Int. Cl.
| | |
|---|---|
| *H01L 21/8234* | (2006.01) |
| *H01L 27/088* | (2006.01) |
| *H02M 1/08* | (2006.01) |
| *H03F 3/34* | (2006.01) |
| *H03K 19/0185* | (2006.01) |
| *H01L 23/528* | (2006.01) |
| *H01L 27/12* | (2006.01) |
| *H01L 49/02* | (2006.01) |
| *H01L 29/06* | (2006.01) |
| *H01L 29/78* | (2006.01) |
| *H03K 3/037* | (2006.01) |

(52) U.S. Cl.
CPC ............ *H01L 27/06* (2013.01); *H01L 27/088* (2013.01); *H01L 27/1203* (2013.01); *H01L 28/24* (2013.01); *H01L 29/063* (2013.01); *H01L 29/0649* (2013.01); *H01L 29/0692* (2013.01); *H01L 29/7817* (2013.01); *H01L 29/7824* (2013.01); *H02M 1/08* (2013.01); *H03F 3/34* (2013.01); *H03K 3/037* (2013.01); *H03K 19/0185* (2013.01)

(56) References Cited

U.S. PATENT DOCUMENTS

| | | | |
|---|---|---|---|
| 2011/0115542 A1* | 5/2011 | Koike | H03K 19/018521 327/333 |
| 2014/0022676 A1* | 1/2014 | Marotta | H02H 7/09 361/33 |
| 2014/0312870 A1 | 10/2014 | Imayoshi et al. | |
| 2015/0303805 A1* | 10/2015 | Franchini | B60T 8/885 323/271 |

FOREIGN PATENT DOCUMENTS

| | | |
|---|---|---|
| JP | 4706381 B2 | 6/2011 |
| JP | 2014-180087 A | 9/2014 |

OTHER PUBLICATIONS

Y. S. Huang et al.; "Extension of Resurf Principle to Dielectrically Isolated Power Devices"; IEEE; Apr. 1991; pp. 27-30.

\* cited by examiner

F I G. 1
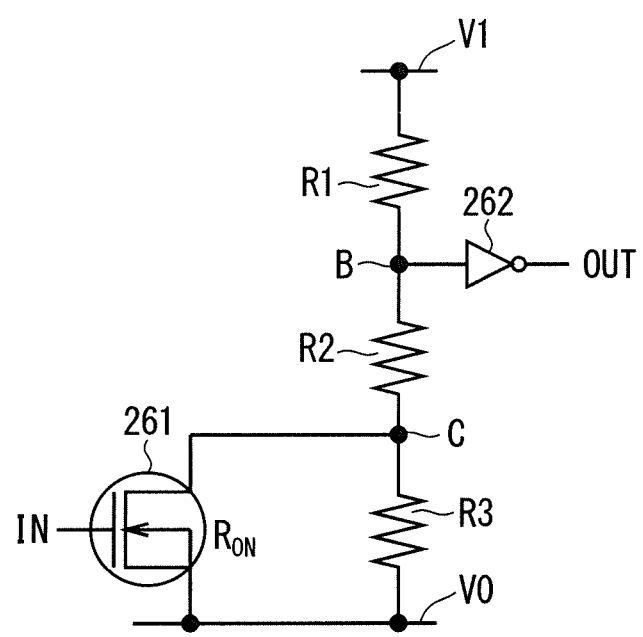

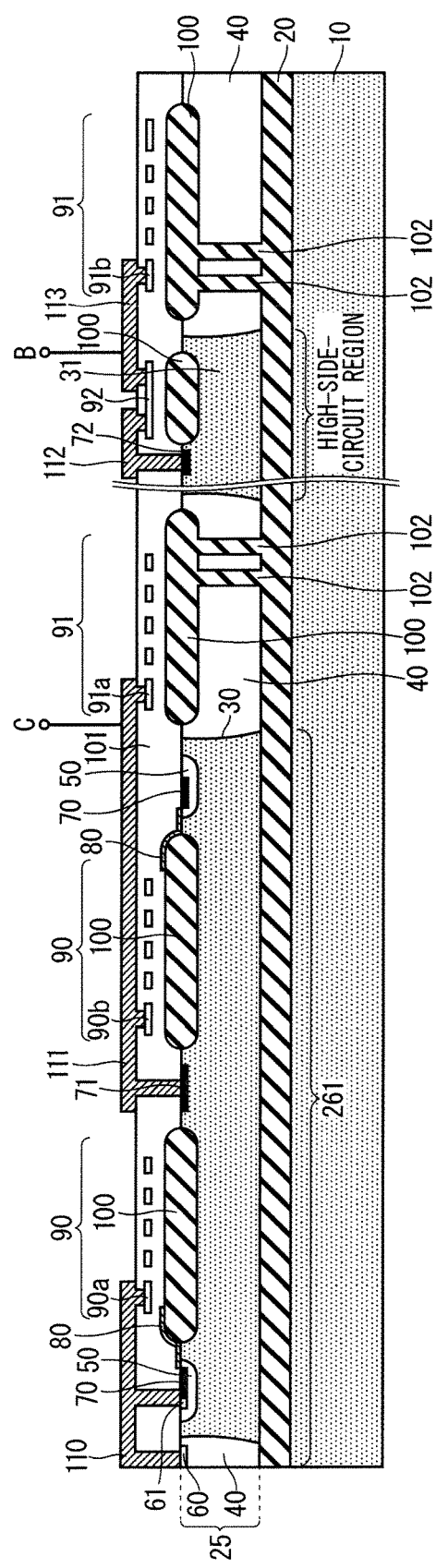
F I G. 3

SEMICONDUCTOR CIRCUIT AND SEMICONDUCTOR DEVICE

TECHNICAL FIELD

The present invention relates to semiconductor circuits electrically connected between low-side circuits and high-side circuits, and to semiconductor devices including the same.

BACKGROUND ART

Proposed are level shift circuits that are semiconductor circuits electrically connected between low-side circuits and high-side circuits whose reference voltages are higher than those of the low-side circuits. Such a level shift circuit transmits a signal between the low-side circuit and the high-side circuit.

Patent Document 1, for instance, proposes a level shift circuit disposed on an SOI substrate. This level shift circuit needs to have a high breakdown voltage that can be resistant to a high voltage.

PRIOR ART DOCUMENTS

Patent Documents

Patent Document 1: Japanese Patent No. 4706381
Patent Document 2: Japanese Patent No. 2739004

Non-Patent Document

Non-Patent Document 1: Y. S. Huang and B. J. Baliga, "EXTENSION OF RESURF PRINCIPLE TO DIELECTRICALLY ISOLATED POWER DEVICES", IEEE, April 1991, Pages 27 to 30

SUMMARY

Problem to be Solved by the Invention

An SOI RESURF structure described in Non-Patent Document 1 provides a breakdown voltage whose upper limit, which depends on the structure of a Silicon on Insulator (SOI) wafer to a certain degree, is practically the order of 500 to 600 V at most. For this reason, a level shift circuit composed of such an SOI RESURF structure cannot achieve any higher breakdown voltage.

In the technique in Patent Document 1, the level shift circuit includes a plurality of Metal Oxide Semiconductor Field Effect Transistors (MOSFETs) with high breakdown voltages. The MOSFETs with high breakdown voltages, which take up a relatively large area, unfortunately upsize the circuit.

To solve these problems, it is an object of the present invention to provide a technique for enhancing the breakdown voltage of a semiconductor device.

Means to Solve the Problem

A semiconductor circuit according to the present invention is electrically connected between a low-side circuit and a high-side circuit whose reference voltage is higher than the reference voltage of the low-side circuit. The semiconductor circuit includes a first resistor, a second resistor, and a third resistor that are connected in series between a power supply and a ground corresponding to the reference voltage of the low-side circuit, and are arranged in this order from the power supply toward the ground. The semiconductor circuit also includes a MOSFET connected to the third resistor in parallel between the second resistor and the ground, and having a gate electrically connected to the low-side circuit. The semiconductor circuit also includes an inverter electrically connected between a connection point and the high-side circuit, the connection point being positioned between the first resistor and the second resistor. The semiconductor circuit satisfies the following expression (2) when the voltage of the power supply is a value V1, when the power supply voltage of the high-side circuit is a value V3, the power supply voltage corresponding to the absolute value of a difference between the voltage of the power supply and the reference voltage of the high-side circuit, when the first resistor has a value R1, when the second resistor has a value R2, when the third resistor has a value R3, when a combined resistance of the on-resistance of the MOSFET combined with the third resistor is a value $R_{CO}$, and when the threshold voltage of the inverter is a value Vinvth:

$$V1-V3 < V1 \times \frac{R2+R_{CO}}{R1+R2+R_{CO}} < \qquad (2)$$

$$Vinvth < V1 \times \frac{R2+R3}{R1+R2+R3}, \text{ where}$$

$$R_{CO} = \frac{R_{ON} \times R3}{R_{ON}+R3}.$$

Effects of the Invention

According to the present invention, the MOSFET is connected to the third resistor in parallel between the second resistor and the ground. Further, the gate of the MOSFET is electrically connected to the low-side circuit. Still further, the inverter is electrically connected between the connection point, positioned between the first resistor and the second resistor, and the high-side circuit. This reduces a voltage applied to the MOSFET, thereby enhancing the breakdown voltage of the semiconductor device.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a circuit diagram schematically illustrating a configuration of a level shift circuit according to a first embodiment.

FIG. 3 is a cross-sectional view of the configuration of the dielectric-isolated driver IC according to the first embodiment.

DESCRIPTION OF EMBODIMENT(S)

Related Art

The following describes, at first, a semiconductor device related to a semiconductor device according to an embodiment of the present invention, followed by the semiconductor device according to the embodiment. The semiconductor device related to the semiconductor device according to a first embodiment is also referred to as a "related semiconductor device".

Figure 13:
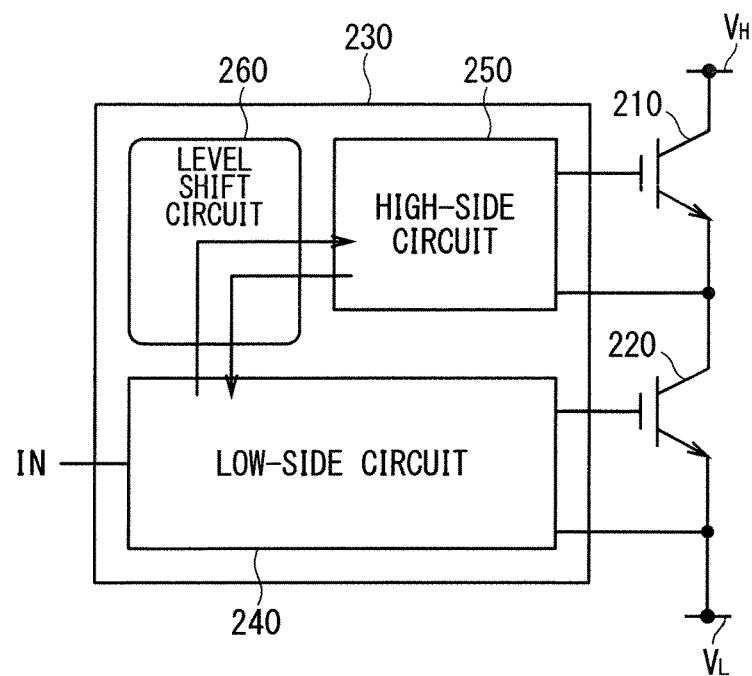
FIG. 13 is a block diagram schematically illustrating a configuration of a related semiconductor device.

FIG. 13 is a block diagram schematically illustrating a configuration of the related semiconductor device. The related semiconductor device in FIG. 13 includes the following: a high-side power chip 210 electrically connected to a power supply VH of high voltage, a low-side power chip 220 electrically connected between the high-side power chip 210 and a power supply VL of low voltage, and a half-bridge driver Integrated Circuit (IC) 230 driving these power chips.

The driver IC 230 includes a low-side circuit 240, a high-side circuit 250, and a level shift circuit 260.

The low-side circuit 240 has an input circuit, which is not shown, and a drive circuit, which is not shown, included in the low-side power chip 220. Moreover, the low-side circuit 240 has a reference voltage corresponding to a substrate potential.

The low-side circuit 250 has a drive circuit, which is not shown, included in the high-side power chip 210. Moreover, the high-side circuit 250 is electrically insulated from a substrate, and has a reference voltage higher than the reference voltage of the low-side circuit 240.

The level shift circuit 260 is electrically connected between the low-side circuit and the high-side circuit, and transmits a signal between the circuits. The level shift circuit related to a level shift circuit according to the first embodiment is also referred to as a "related level shift circuit".

Figure 14:
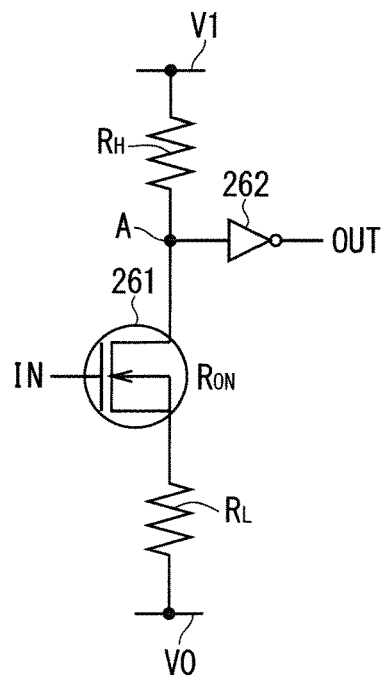
FIG. 14 is a circuit diagram schematically illustrating a configuration of a related level shift circuit.

FIG. 14 is a circuit diagram schematically illustrating a configuration of the related level shift circuit. For easy understanding, the signs and physical quantities of components are identical to each other in the following description; for instance, the voltage of the power supply V1 is referred to as a voltage V1.

The related level shift circuit in FIG. 14 includes resistors $R_H$ and $R_L$, an NMOS 261, which is an N-type MOSFET having a high breakdown voltage, and an inverter 262.

The resistor $R_H$, the NMOS 261, and the resistor $R_L$ are connected in series between a power supply V1 having a high voltage V1 and a ground V0 corresponding to the reference voltage of the low-side circuit 240. The resistor $R_H$, the NMOS 261, and the resistor $R_L$ are arranged in this order from the power supply V1 toward the ground V0. The NMOS 261 has a gate electrically connected to the low-side circuit 240 in FIG. 13. The inverter 262 is electrically connected between a connection point A and the high-side circuit 250 in FIG. 13, the connection point A being located between the resistor $R_H$ and the drain of the NMOS 261.

The circuit with such a configuration in FIG. 14 shifts the level of a signal IN that is input from the low-side circuit 240 to the gate of the NMOS 261, and outputs a signal OUT generated by the level shift from the inverter 262 to the high-side circuit 250.

Figure 15:
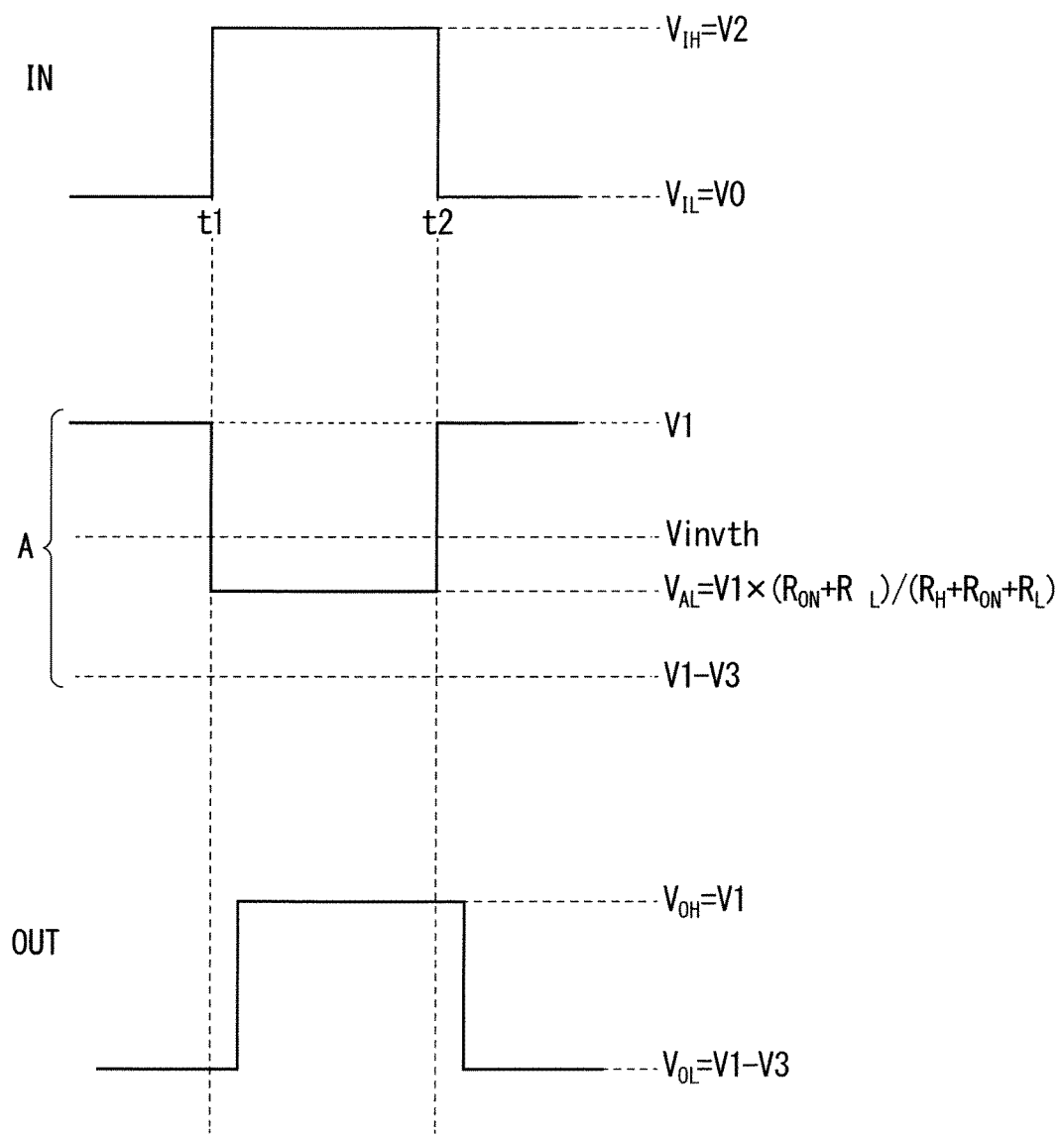
FIG. 15 is a timing chart illustrating an operational sequence in the related level shift circuit.

FIG. 15 is a timing chart illustrating the operational sequence of a signal voltage in the related level shift circuit. The timing chart in FIG. 15 includes the voltage of the signal IN, input to the related level shift circuit, the voltage at the connection point A in FIG. 14, and the voltage of the signal OUT, output from the related level shift circuit.

The NMOS 261 is OFF during a time (t<t1, t>t2) during which the signal IN has a voltage $V_{IL}$. As a result, no current flows through the NMOS 261. Thus, the connection point A has a high voltage V1, which is the same as the power supply V1.

The NMOS 261 is ON during a time (t1<t<t2) during which the signal IN has a voltage $V_{IH}$. As a result, the connection A has a voltage $V_{AL}$ expressed by the following expression (1). It is noted that $R_{ON}$ is the on-resistance of the NMOS 261.

$$V_{AL} = V1 \times \frac{R_{ON} + R_L}{R_H + R_{ON} + R_L} \tag{1}$$

Here, an appropriate signal OUT can be output from the inverter 262 to the high-side circuit 250 when the voltage $V_{AL}$ is higher than the reference voltage (=V1−V3) of the high-side circuit 250, and when the threshold, Vinvth, of the inverter 262 in a stage following the connection point A falls in a range between the high voltage V1 and the voltage $V_{AL}$. Here, the voltage V3 is the power supply voltage of the high-side circuit 250, by extension, the power supply voltage of a region in which the high-side circuit 250 is disposed. Moreover, the voltage V3 corresponds to the absolute value of a difference between the high voltage V1 and the reference voltage (=V1−V3) of the high-side circuit 250.

Such a configuration enables the signal OUT having a voltage $V_{OL}$ (=V1−V3) to be output to the high-side circuit 250 when the voltage at the connection point A is the high voltage V1 that is greater than the threshold Vinvth. In addition, this configuration enables the signal OUT having a voltage $V_{OH}$ (=V1) to be output to the high-side circuit 250 when the voltage at the connection point A is the voltage $V_{AL}$ that is smaller than the threshold Vinvth.

In the following description, a region in which the high-side circuit 250 is disposed on the substrate is referred to as a "high-side-circuit region"; and a region in which the low-side circuit 240 on the substrate, as a "low-side-circuit region".

The driver IC 230 in FIG. 13, which is a dielectric-isolated semiconductor device, can be disposed on a substrate. Then, surrounding a high-side-circuit region on the substrate with a dielectric substance enables the high-side-circuit region to be electrically insulated from the substrate, thereby enhancing the breakdown voltage of the semiconductor device. However, this alone does not sufficiently enhance the breakdown voltage of the semiconductor device; also the NMOS 261 in FIG. 14, included in the level shift circuit 260 in FIG. 13, needs to have an enhanced breakdown voltage. To be specific, a high voltage between the high-side circuit 250 and the low-side circuit 240 needs to be maintained between the source and drain of the NMOS 261. Accordingly, an SOI RESURF structure described in Non-Patent Document 1 can be used in order to enhance the breakdown voltage of the NMOS 261.

Figure 16:
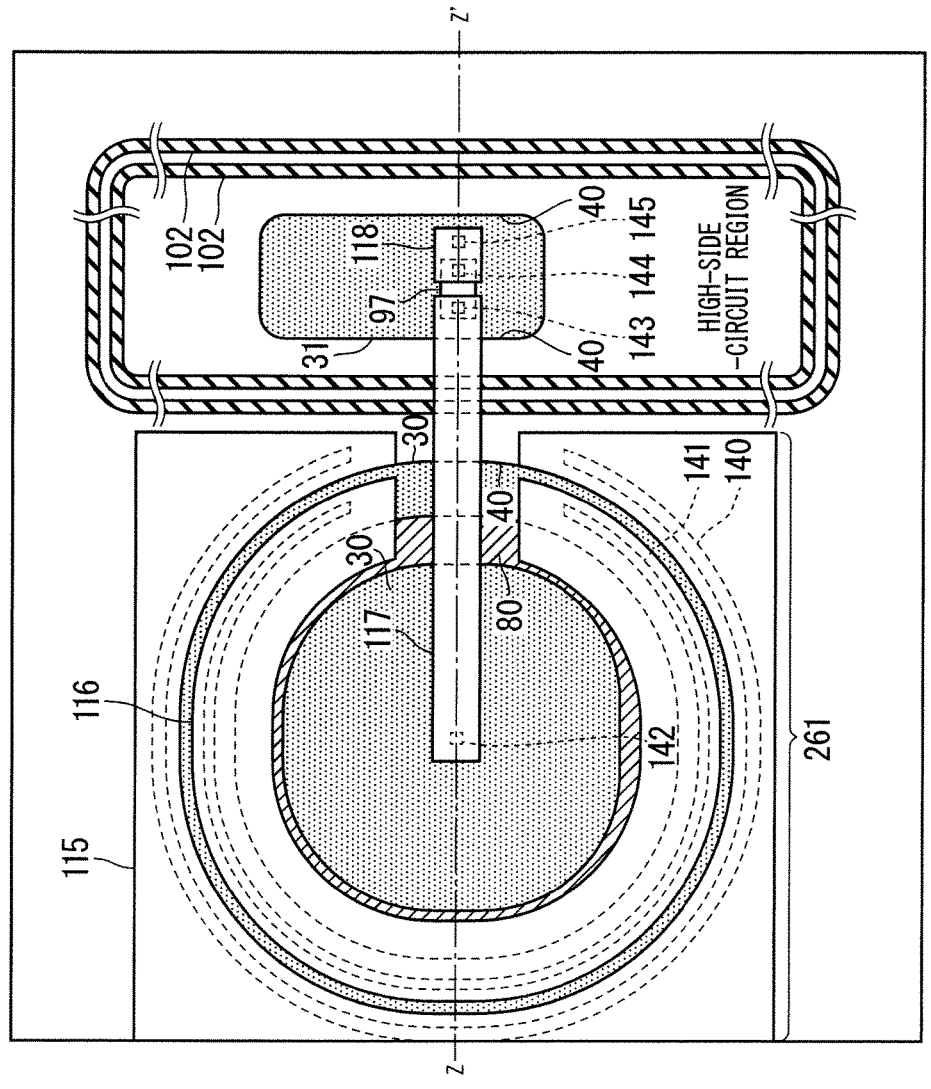
FIG. 16 is a plan view of a configuration of a dielectric-isolated driver IC of a related semiconductor device.
Figure 17:
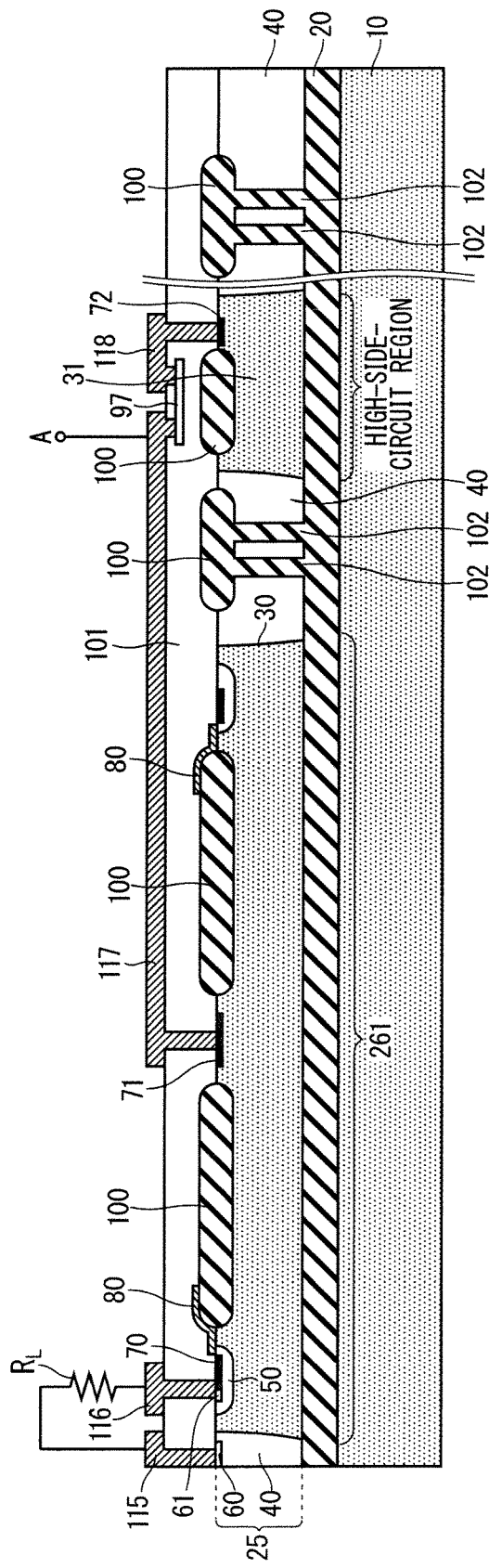
FIG. 17 is a cross-sectional view of the configuration of the dielectric-isolated driver IC of the related semiconductor device.

FIG. 16 is a plan view of a configuration of a dielectric-isolated driver IC having an SOI RESURF structure. FIG. 17 is a cross-sectional view of the configuration taken along line Z-Z' in FIG. 16. For simplification, FIG. 16 does not illustrate diffusion layers except an N-type diffusion layer 30 and a P-type diffusion layer 40, both of which will be described later on, an insulating film 100, and other components.

The driver IC illustrated in FIGS. 16 and 17 includes the related level shift circuit. As illustrated in FIG. 17, a substrate on which the related level shift circuit is disposed includes an N-type support substrate 10, a buried oxide film 20 disposed on a surface of the N-type support substrate 10, and an SOI layer 25 disposed on a surface of the buried oxide film 20. The substrate has a main surface, that is, the main surface of the SOI layer 25, on which the N-type diffusion layer 30, an N-type diffusion layer 31, the P-type diffusion layer 40, and a trench isolator 102, which is an insulator such as an oxide film, are mainly disposed. Accordingly, the related level shift circuit in FIG. 14 is disposed on this substrate.

As illustrated in FIGS. 16 and 17, the trench isolator 102 is disposed on the main surface of the substrate so as to surround the N-type diffusion layer 31 and the P-type diffusion layer 40 in the high-side-circuit region. Accordingly, the high-side-circuit region is insulated from a substrate voltage, and thus has an enhanced breakdown voltage. In the example in FIGS. 16 and 17, the low-side-circuit region is defined in a region on the main surface of the substrate other than the high-side-circuit region. The NMOS 261 of the related level shift circuit is disposed within the low-side-circuit region.

The N-type diffusion layer 30 in FIGS. 16 and 17 serves as a drain drift layer of the NMOS 261 in FIG. 14. The drain of the NMOS 261 substantially corresponds to an N-type diffusion layer 71 that is disposed at the center of a surface of the N-type diffusion layer 30. As illustrated in FIG. 17, the insulating film 100 such as an oxide film, is disposed from the center to outer periphery of the surface of the N-type diffusion layer 30. A P-type well region 50 is disposed, through the N-type diffusion layer 30, in an outer periphery outside the insulating film 100 on the surface of the N-type diffusion layer 30. The P-type well region 50 has a surface on which an N-type diffusion layer 70, which is the source of the NMOS 261, and a P+type contact region 61 are disposed. A conductive film 80, which is a gate, is disposed on the P-type well region 50 between the N-type diffusion layer 70, which is the source, and the N-type diffusion layer 30. The NMOS 261 with such a configuration, which includes the N-type diffusion layer 30 serving as a RESURF isolation region, achieves a RESURF effect and thus has an enhanced breakdown voltage.

An insulating film 101 such as an oxide film, is disposed on the insulating film 100, the conductive film 80, and other components.

A polysilicon resistor 97 is disposed within the high-side-circuit region in plan view (FIG. 16), and in the upper part of the insulating film 101 in cross-sectional view (FIG. 17). The polysilicon resistor 97 is included in the resistor $R_H$ in FIG. 14.

As illustrated in FIG. 17, metal wire layers 117 and 118 are disposed on the insulating film 101.

The metal wire layer 118 is electrically connected to one end of the polysilicon resistor 97 through a contact 144 in FIG. 16, and electrically connected to the N-type diffusion layer 31 in FIG. 17 through a contact 145 in FIG. 16 and an N-type diffusion layer 72 in FIG. 17. Here, the N-type diffusion layer 31 has a voltage electrically connected to the power supply V1 in FIG. 14. Accordingly, the polysilicon resistor 97, which is the resistor $R_H$, is electrically connected to the power supply V1 through the metal wire layer 118 and other components, and corresponds to part of the circuit diagram in FIG. 14.

The metal wire layer 117 is electrically connected to the other end of the polysilicon resistor 97 through a contact 143 in FIG. 16, and electrically connected to the N-type diffusion layer 30, which is the drain of the NMOS 261, through a contact 142 in FIG. 16 and the N-type diffusion layer 71 in FIG. 17. Here, a terminal A in FIG. 17 connected to the metal wire layer 117 corresponds to the connection point A in FIG. 14, and is electrically connected to the inverter 262 in FIG. 1, which is not shown in FIG. 17. Accordingly, the polysilicon resistor 97, which is the resistor $R_H$, is electrically connected to the drain of the NMOS 261 through the connection point A, and corresponds to part of the circuit diagram in FIG. 14.

A metal wire layer 116 illustrated in FIGS. 16 and 17 is electrically connected to the N-type diffusion layer 70 in FIG. 17, which is the source, and the P+type contact region 61 through a substantially C-shaped contact 141 indicated by a dashed line in FIG. 16. The metal wire layer 116 is also electrically connected to one end of the resistor $R_L$ in FIG. 17. Accordingly, the one end of the resistor $R_L$ is electrically connected to the source of the NMOS 261 through the metal wire layer 116 and other components, and corresponds to part of the circuit diagram in FIG. 14. The resistor $R_L$, although in FIG. 17 denoted by a circuit symbol externally attached to the substrate, is practically disposed on the substrate in FIG. 17, like the other components.

The other end of the resistor $R_L$ in FIG. 17 is electrically connected to a metal wire layer 115. The metal wire layer 115 is electrically connected to the P-type diffusion layer 40 in the low-side-circuit region through a substantially C-shaped contact 140 indicated by a dashed line in FIG. 16 and a P-type diffusion layer 60 in FIG. 17. Here, the P-type diffusion layer 40 in the low-side-circuit region is electrically connected to the ground V0 in FIG. 14. Accordingly, the resistor $R_L$ is electrically connected to the ground V0 through the metal wire layer 115 and other components, and corresponds to part of the circuit diagram in FIG. 14.

As clearly seen from the above description, particularly, from the voltage at the connection point A in FIG. 15, the same voltage as the high voltage V1 is applied to the drain of the NMOS 261, as appropriate. Hence, the NMOS 261 requires, between its drain and source, a breakdown voltage that is equal to that in the high-side-circuit region. The related level shift circuit has the SOI RESURF structure for an enhanced breakdown voltage, whose upper limit is practically the order of 500 to 600 V at most. For this reason, the related level shift circuit cannot have any higher breakdown voltage, thus failing to sufficiently enhance the breakdown voltage of the dielectric-isolated driver IC. The embodiment of the present invention described below, in contrast, allows a level shift circuit and a semiconductor device to have further enhanced breakdown voltages without enhancing the breakdown voltage of the NMOS 261 per se.

First Embodiment

FIG. 1 is a circuit diagram schematically illustrating a configuration of a level shift circuit according to the first embodiment of the present invention. A semiconductor device according to the first embodiment has a configuration similar to the configuration in FIG. 13. Hereinafter, identical or similar components between the first embodiment and the related art are denoted by the same reference signs. Mainly described are components different between the first embodiment and the related art.

The level shift circuit in FIG. 1 includes a first resistor R1, a second resistor R2, a third resistor R3, the NMOS 261, and the inverter 262.

The first resistor R1, the second resistor R2, and the third resistor R3 are connected in series between the power supply V1 and the ground V0, and are arranged in this order from the power supply V1 toward the ground V0. The power supply V1, like the related art, has a high voltage of, for instance, several hundred volts.

The NMOS 261, which is a MOSFET, is connected to the third resistor R3 in parallel between the second resistor R2 and the ground V0. The NMOS 261 has a gate electrically connected to the low-side circuit 240 in FIG. 13. The inverter 262 is electrically connected to a connection point B and the high-side circuit 250 in FIG. 13, the connection point B being located between the first resistor R1 and the second resistor R2.

The circuit with such a configuration changes the voltage at the connection point B in response to the signal IN that is input from the low-side circuit 240 to the gate of the NMOS 261, and outputs, to the high-side circuit 250, the signal OUT that is output from the inverter 262 in response to the voltage input at the connection point B.

Here, let the high voltage of the power supply V1 be a value V1. Further, let the power supply voltage of the high-side circuit 250 be a value V3, the power supply voltage corresponding to the absolute value of a difference between the voltage V1 of the power supply V1 and the reference voltage (=V1−V3) of the high-side circuit 250. Still further, let the first resistor R1 have a value R1; the second resistor R2, a value R2; and the third resistor R3, a value R3. Yet further, let a combined resistance of the on-resistance, $R_{ON}$, of the NMOS 261 combined with the third resistor R3 be a value $R_{CO}$. Still yet further, let the threshold voltage of the inverter 262 be a value Vinvth. Then, the circuit is configured so as to satisfy the following expression (2):

$$V1 - V3 < V1 \times \frac{R2 + R_{CO}}{R1 + R2 + R_{CO}} < \qquad (2)$$

$$Vinvth < V1 \times \frac{R2 + R3}{R1 + R2 + R3}, \text{ where}$$

$$R_{CO} = \frac{R_{ON} \times R3}{R_{ON} + R3}.$$

Figure 2:
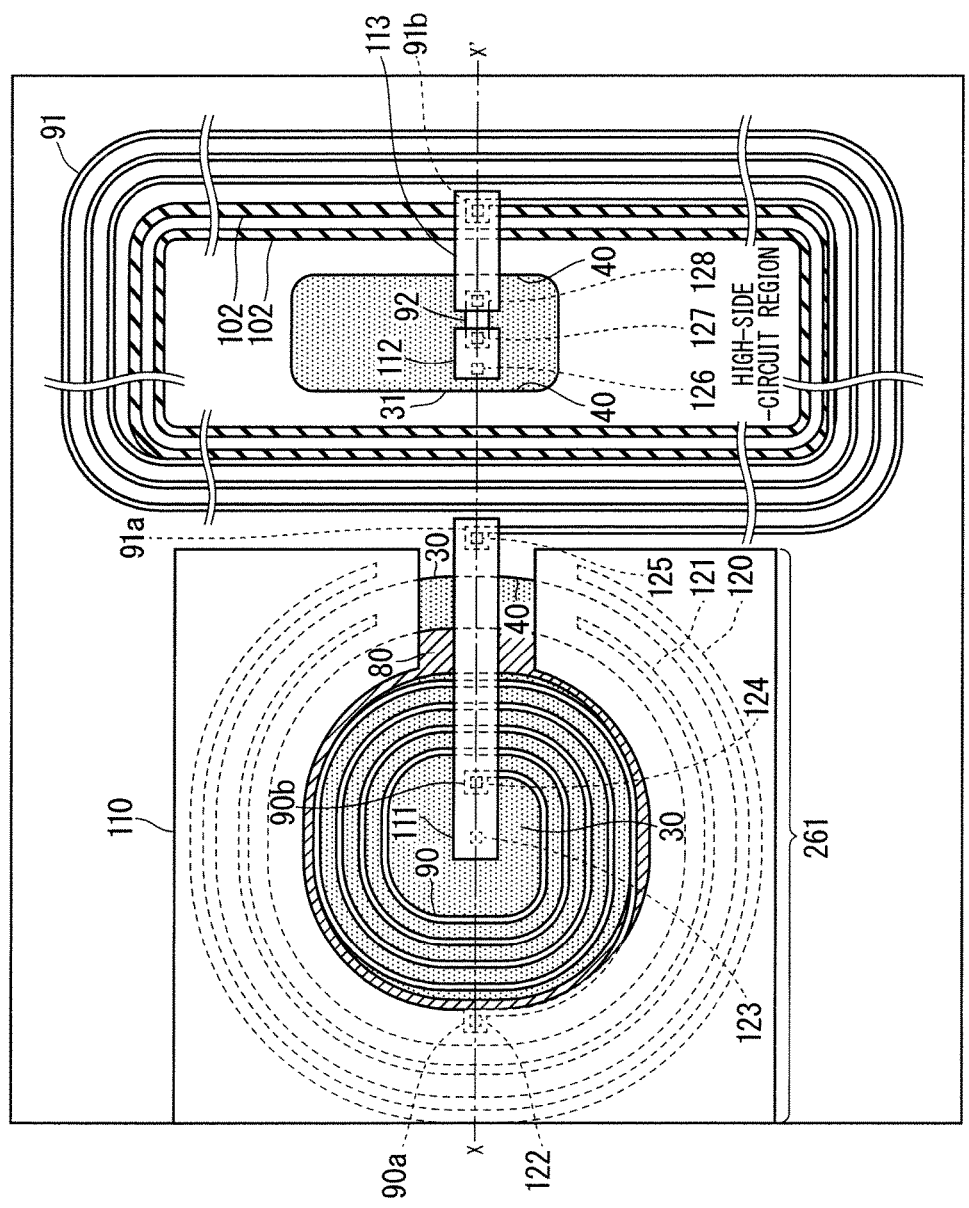
FIG. 2 is a plan view of a configuration of a dielectric-isolated driver IC according to the first embodiment.

FIG. 2 is a plane view of a configuration of a dielectric-isolated driver IC according to the first embodiment. FIG. 3 is a cross-sectional view of the configuration taken along line X-X' in FIG. 2. For simplification, FIG. 2 does not illustrate diffusion layers except the N-type diffusion layer 30 and the P-type diffusion layer 40, the insulating film 100, and other components.

The driver IC in FIGS. 2 and 3 includes the level shift circuit according to the first embodiment. As illustrated in FIG. 3, a substrate on which the level shift circuit according to the first embodiment is disposed includes the N-type support substrate 10, the buried oxide film 20, and the SOI layer 25. The substrate has a main surface, that is, the main surface of the SOI layer 25, on which the N-type diffusion layers 30 and 31, the P-type diffusion layer 40, and the trench isolator 102, which is an insulator such as an oxide film, are mainly disposed. Accordingly, the level shift circuit in FIG. 1 according to the first embodiment is disposed on this substrate.

As illustrated in FIGS. 2 and 3, the trench isolator 102 that is a first insulator is disposed on the main surface of the substrate so as to surround the N-type diffusion layer 31 in the high-side-circuit region and the P-type diffusion layer 40. Accordingly, the high-side-circuit region is insulated from a substrate voltage, and thus has an enhanced breakdown voltage. Herein, the reference voltage of the low-side-circuit region is a ground voltage V0. Further, the reference voltage of the high-side-circuit region is a voltage (=V1−V3) higher than the ground voltage V0 by the order of several hundred voltages. The trench isolator 102, although being double in the example in FIGS. 2 and 3, may be single for instance, or may be triple or more.

In the example in FIG. 2, the low-side-circuit region is defined in a region on the main surface of the substrate other than the high-side-circuit region. The NMOS 261 of the level shift circuit is disposed within the low-side-circuit region. The NMOS 261 may be disposed in, for instance, a region different from the low-side-circuit region.

The N-type diffusion layer 30 in FIGS. 2 and 3 serves as a drain drift layer of the NMOS 261 in FIG. 1. The drain of the NMOS 261 substantially corresponds to the N-type diffusion layer 71 that is disposed at the center of the surface of the N-type diffusion layer 30. As illustrated in FIG. 3, the insulating film 100 such as an oxide film, is disposed from the center to outer periphery of the surface of the N-type diffusion layer 30. The P-type well region 50 is disposed, through the N-type diffusion layer 30, in an outer periphery outside the insulating film 100 on the surface of the N-type diffusion layer 30. The P-type well region 50 has a surface on which the N-type diffusion layer 70, which is the source of the NMOS 261, and the P+type contact region 61 are disposed. The conductive film 80, which is a gate, is disposed on the P-type well region 50 between the N-type diffusion layer 70, which is the source, and the N-type diffusion layer 30.

The drain and source of the lateral NMOS 261 with such a configuration are spaced away from each other on the main surface of the substrate. The NMOS 261, which includes the N-type diffusion layer 30 serving as a RESURF isolation region, achieves a RESURF effect and thus has an enhanced breakdown voltage.

The insulating film 101 such as an oxide film, is disposed on the insulating film 100, the conductive film 80, and other components.

In cross-sectional view (FIG. 3), the insulating film 101 has an upper part in which polysilicon resistors 90, 91, and 92 are disposed. Moreover, disposed on the insulating film 101 are metal wire layers 110, 111, 112, and 113. Although not shown, a field plate formed of polysilicon or a metal wire layer may be provided, like the technique in Patent Document 2.

The polysilicon resistor 92 is disposed within the high-side-circuit region in plan view (FIG. 2). The polysilicon resistor 92 is included in the first resistor R1 in FIG. 1.

The metal wire layer 112 is electrically connected to one end of the polysilicon resistor 92 through a contact 127 in FIG. 2, and electrically connected to the N-type diffusion layer 31 in FIG. 3 through a contact 126 in FIG. 2 and the N-type diffusion layer 72 in FIG. 3. Here, the N-type diffusion layer 31 has a voltage electrically connected to the power supply V1 in FIG. 1. Accordingly, the polysilicon resistor 92, which is the resistor R1, is electrically connected to the power supply V1 through the metal wire layer 112 and other components, and corresponds to part of the circuit diagram in FIG. 1.

The polysilicon resistor 91 has, in plan view (FIG. 2), a spiral shape and is provided so as to surround the outer periphery of the high-side-circuit region. The polysilicon resistor 91 is included in the second resistor R2 in FIG. 1.

The metal wire layer 113 is electrically connected to the other end of the polysilicon resistor 92 through a contact 128 in FIG. 2, and electrically connected to one end, 91b, of the polysilicon resistor 91. Here, a terminal B in FIG. 3 connected to the metal wire layer 113 corresponds to the connection point B in FIG. 1, and is electrically connected to the inverter 262 in FIG. 1, which is not shown in FIG. 3. Accordingly, the polysilicon resistor 92, which is the resistor R1, is electrically connected to the polysilicon resistor 91, which is the second resistor R2, through the connection point B. The polysilicon resistor 92 corresponds to part of the circuit diagram in FIG. 1.

The polysilicon resistor 90 has, in plan view (FIG. 2), a spiral shape and is disposed on the RESURF isolation region of the NMOS 261. The polysilicon resistor 90 is included in the third resistor R3 in FIG. 1.

The metal wire layer 111 is electrically connected to the other end, 91a, of the polysilicon resistor 91 through a contact 125 in FIG. 2, and electrically connected to one end, 90b, of the polysilicon resistor 90 through a contact 124 in FIG. 2. Here, a terminal C in FIG. 3 connected to the metal wire layer 111 corresponds to a connection point C in FIG. 1. Accordingly, the polysilicon resistor 91, which is the second resistor R2, is electrically connected to the polysilicon resistor 90, which is the third resistor R3, through the connection point C in FIG. 1. The polysilicon resistor 91 corresponds to part of the circuit diagram in FIG. 1.

The metal wire layer 111 is electrically connected to the N-type diffusion layer 30, which is the drain of the NMOS 261, through a contact 123 in FIG. 2 and the N-type diffusion layer 71 in FIG. 3. Accordingly, the polysilicon resistor 91, which is the second resistor R2, and the polysilicon resistor 90, which is the third resistor R3, are electrically connected to the drain of the NMOS 261 through the connection point C in FIG. 1. The polysilicon resistors 90 and 91 correspond to part of the circuit diagram in FIG. 1.

The metal wire layer 110 is electrically connected to the other end, 90a, of the polysilicon resistor 90 through a contact 122 in FIG. 2, and electrically connected to the N-type diffusion layer 70 in FIG. 3, which is the source, and the P-type contact region 61 in FIG. 3 through a substantially C-shaped contact 121 indicated by a dashed line in FIG. 2. Accordingly, the polysilicon resistor 90, which is the third resistor, is electrically connected to the source of the NMOS 261, and corresponds to part of the circuit diagram in FIG. 1.

The metal wire layer 110 is electrically connected to the P-type diffusion layer 40 in the low-side-circuit region through a substantially C-shaped contact 120 indicated by a dashed line in FIG. 2 and the P-type diffusion layer 60 in FIG. 3. Here, the P-type diffusion layer 40 in the low-side-circuit region is electrically connected to the ground V0 in FIG. 1. Accordingly, the polysilicon resistor 90, which is the third resistor, and the source of the NMOS 261 are electrically connected to the ground V0 through the metal wire layer 110 and other components. The polysilicon resistor 90 and the source of the NMOS 261 correspond to part of the circuit diagram in FIG. 1.

Figure 4:
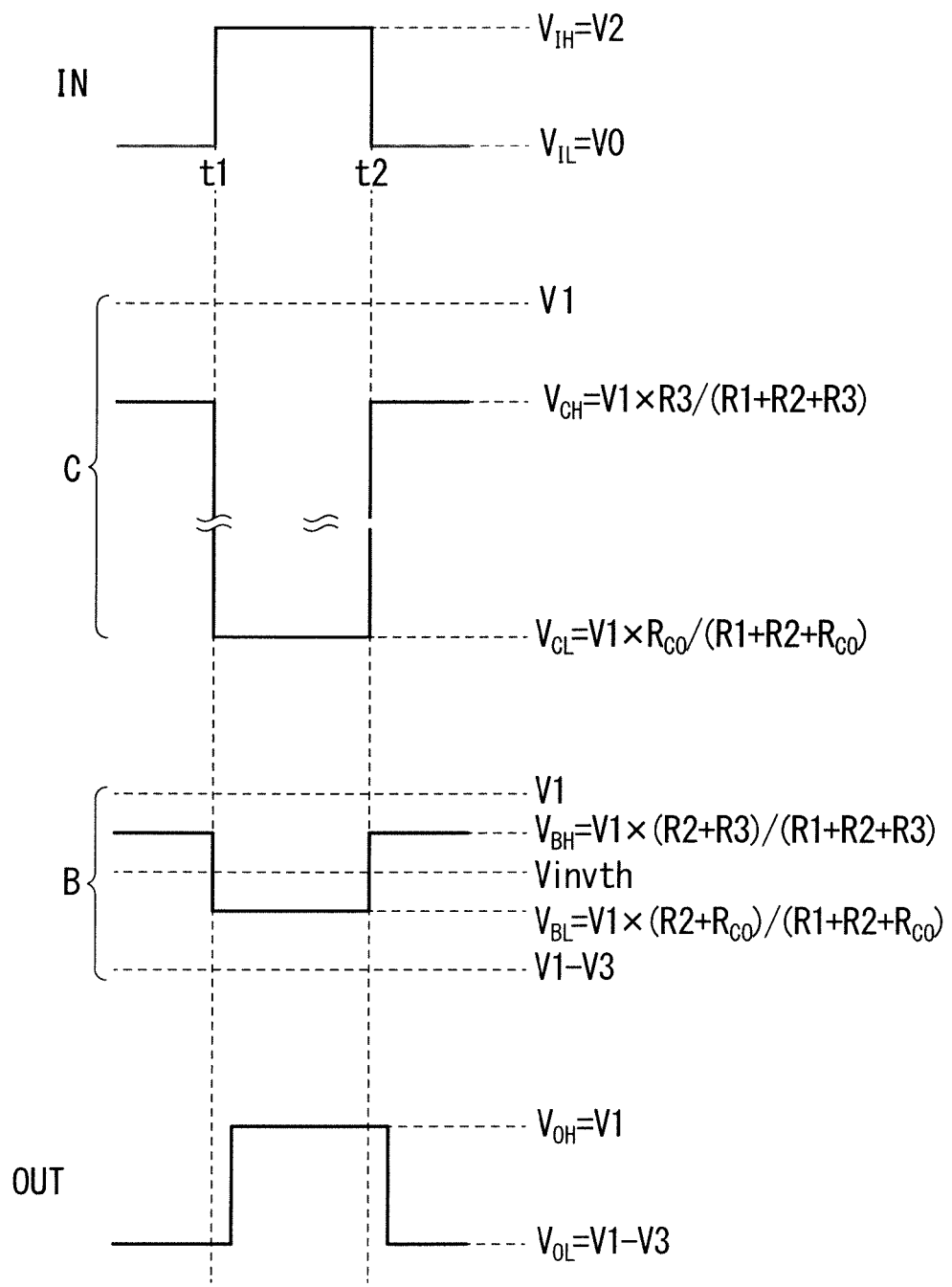
FIG. 4 is a timing chart illustrating an operational sequence in the level shift circuit according to the first embodiment.

FIG. 4 is a timing chart illustrating an operational sequence relating to a signal voltage in the level shift circuit according to the first embodiment with the configuration in FIG. 1. The timing chart in FIG. 4 includes the voltage of the signal IN, input to the level shift circuit, the voltages at the connection points B and C in FIG. 1, and the voltage of the signal OUT, output from the level shift circuit.

The NMOS 261 is OFF during a time (t<t1, t>t2) during which the signal IN has a voltage $V_{IL}$. As a result, the connection B has a voltage $V_{BH}$ expressed by the following expression (3):

$$V_{BH} = V1 \times \frac{R2 + R3}{R1 + R2 + R3}. \tag{3}$$

The NMOS 261 is ON during a time (t1<t<t2) during which the signal IN has a voltage $V_{IH}$. As a result, a current flows also through the NMOS 261. Thus, the connection point B has a voltage $V_{BL}$ expressed by the following expression (4). It is noted that $R_{CO}$ is the same as $R_{CO}$ that has appeared in the note in the expression (2).

$$V_{BL} = V1 \times \frac{R2 + R_{CO}}{R1 + R2 + R_{CO}} \tag{4}$$

The expression (2) is satisfied in the first embodiment. Thus, the voltage $V_{BL}$ is higher than the reference voltage (=V1−V3) of the high-side-circuit region, on the basis of a condition of the expression (2): $V_{BL}$>V1−V3. Moreover, the threshold Vinvth of the inverter 262 in a stage following the connection point B falls in a range between the voltages $V_{BL}$ and $V_{BH}$ at the connection point B, on the basis of the remaining conditions of the expression (2). This enables a suitable signal OUT to be output from the inverter 262 to the high-side circuit 250.

To be specific, a signal OUT having a voltage $V_{OL}$(=V1−V3) is output to the high-side circuit 250 when the connection point B has a voltage $V_{BH}$ larger than the threshold Vinvth. In addition, a signal OUT having a voltage $V_{OH}$ (=V1) is output to the high-side circuit 250 when the connection point B has a voltage $V_{BL}$ smaller than the threshold Vinvth.

Here, the connection point C has a voltage $V_{CH}$ expressed by the following expression (5) during a time (t<t1, t>t2) during which the signal IN has the voltage $V_{IL}$. In addition, the connection point C has a voltage $V_{CL}$ expressed by the following expression (6) during a time (t1<t<t2) during which the signal IN has the voltage $V_{IH}$. In this way, the voltage $V_{CH}$ lower than the high voltage V1 at the maximum is applied to the connection point C, that is, to the NMOS 261.

$$V_{CH} = V1 \times \frac{R3}{R1 + R2 + R3} \quad (5)$$

$$V_{CL} = V1 \times \frac{R_{CO}}{R1 + R2 + R_{CO}} \quad (6)$$

<Gist of First Embodiment>

The first embodiment enables the maximum value of the voltage applied to the NMOS 261 to be reduced down to the voltage $V_{CH}$, which is lower than the high voltage V1. This allows the level shift circuit and the semiconductor device to have enhanced breakdown voltages without enhancing the breakdown voltage of the NMOS 261 per se.

In the first embodiment, the circuit and the device that provide such an effect are formed using components, such as the polysilicon resistors 90 and 91 each having a spiral shape in plan view. This prevents an increase in the sizes of the circuit and the device.

<First Modification>

The first embodiment describes that the polysilicon resistor 91, which is the second resistor R2, is disposed in the upper part of the insulating film 101, as illustrated in FIG. 3. The spiral-shaped polysilicon resistor 91, serving as the second resistor R2, may be buried inside the trench isolator 102 so as to surround the outer periphery of the high-side-circuit region. In this configuration, instead of the spiral-shaped polysilicon resistor 91, the SOI layer 25 having a spiral shape, or the SOI layer 25 with an impurity diffused in a spiral shape may serve as the second resistor R2.

Figure 5:
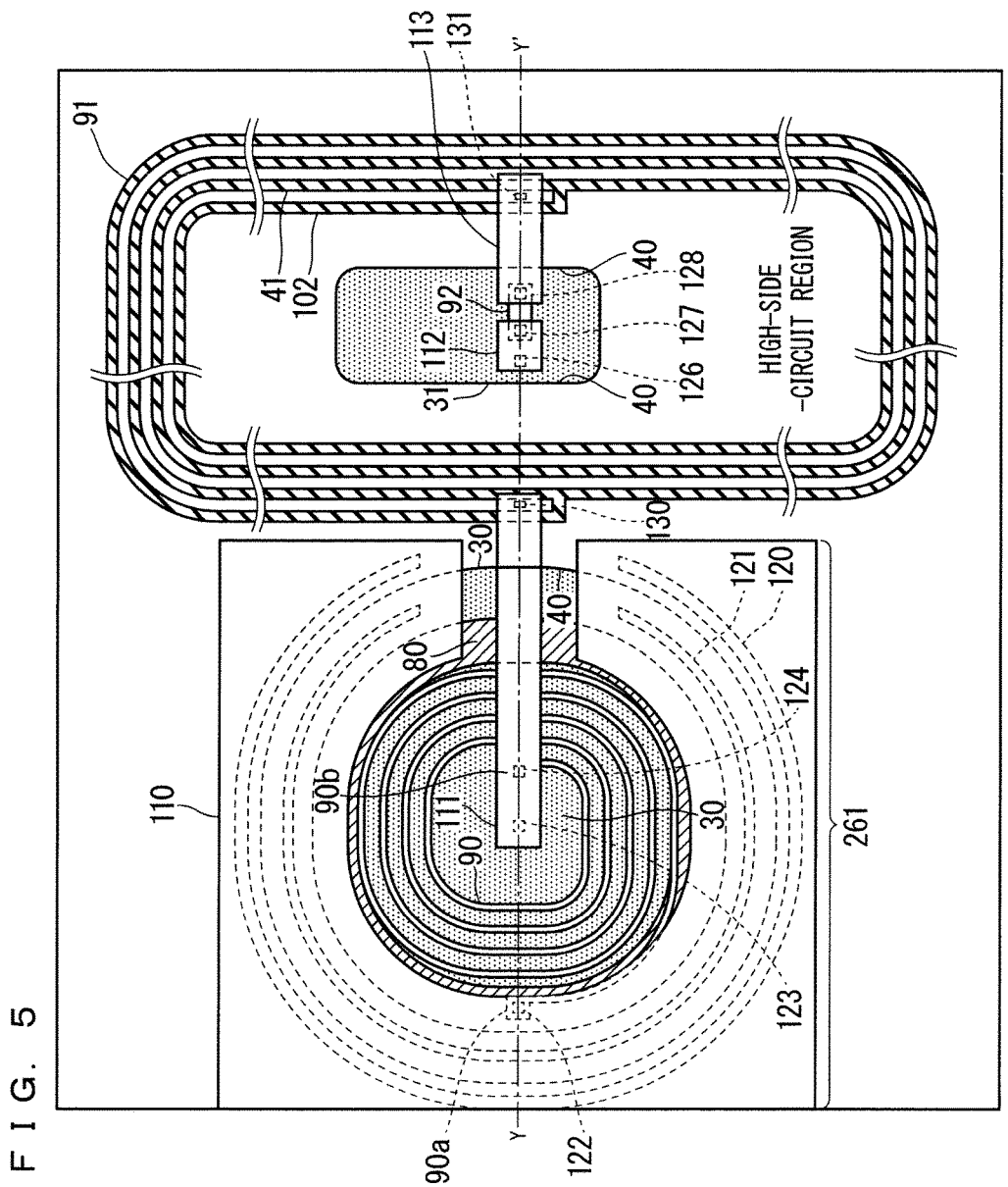
FIG. 5 is a plan view of a configuration of a dielectric-isolated driver IC according to a first modification.
Figure 6:
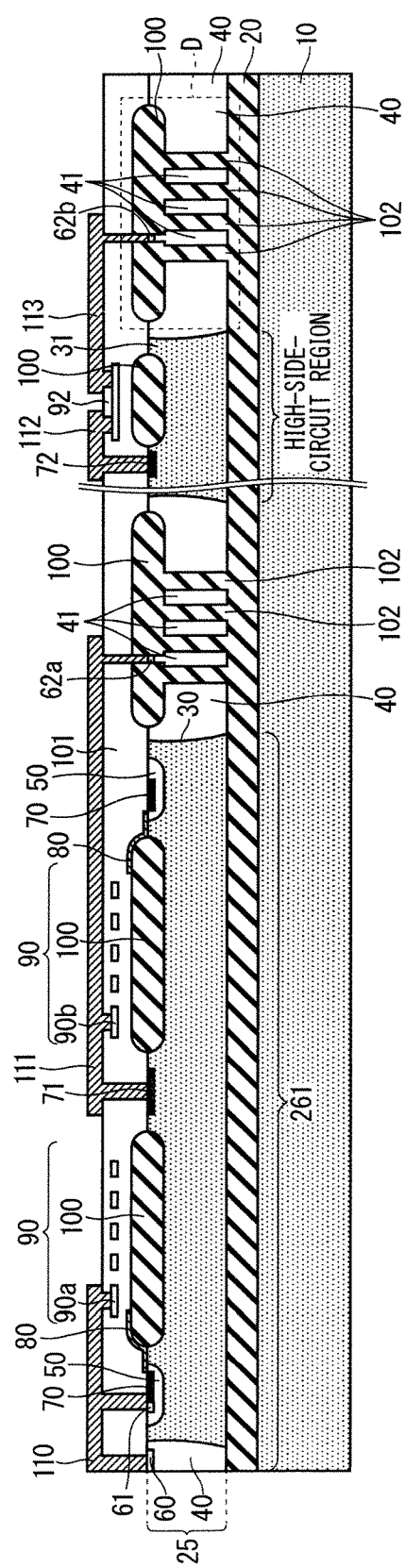
FIG. 6 is a cross-sectional view of the configuration of the dielectric-isolated driver IC according to the first modification.
Figure 7:
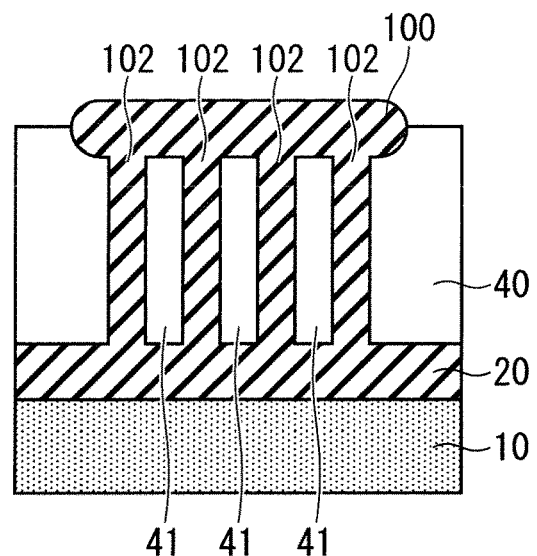
FIG. 7 is an enlarged cross-sectional view of the configuration of the dielectric-isolated driver IC according to the first modification.

FIG. 5 is a plan view of a configuration of a dielectric-isolated driver IC according to a first modification. FIG. 6 is a cross-sectional view of the configuration taken along line Y-Y' in FIG. 5. FIG. 7 is an enlarged cross-sectional view of a portion D indicated by a dashed line in FIG. 6.

In FIGS. 5 to 7, a diffusion layer 41 that is the SOI layer 25 with an impurity diffused serves as the second resistor R2. It is noted that the diffusion layer 41, although herein being a P-type diffusion layer, may be an N-type diffusion layer.

As illustrated in FIG. 5, the diffusion layer 41 has a spiral shape and is buried inside the trench isolator 102 so as to surround the outer periphery of the high-side-circuit region. The diffusion layer 41 has one end on its low-voltage side. This one end is electrically connected to the metal wire layer 111 through a P+type diffusion layer 62*a* in FIG. 6 and a contact 130 in FIG. 5. The diffusion layer 41 has one end on its high-voltage side. This one end is electrically connected to the metal wire layer 113 through a P+type diffusion layer 62*b* in FIG. 6 and a contact 131 in FIG. 5.

In the first modification, a resistor serving as the second resistor R2 has a spiral shape and is buried inside the trench isolator 102 so as to surround the outer periphery of the high-side-circuit region. This achieves resistor formation and the insulation of the high-side-circuit region at the same time. In addition, this further prevents the increase in the sizes of the circuit and the device.

Figure 8:
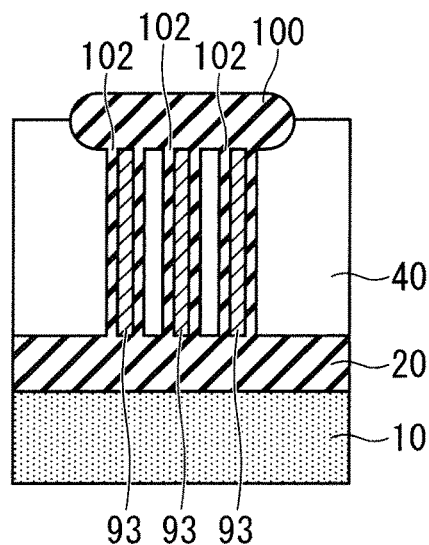
FIG. 8 is an enlarged cross-sectional view of another configuration of the dielectric-isolated driver IC according to the first modification.

It is noted that although the diffusion layer 41 serves as the second resistor R2 in the above description, a polysilicon resistor may serve as the second resistor R2 as a matter of course, like the first embodiment. FIG. 8 is an enlarged cross-sectional view of part of a configuration including a polysilicon resistor 93 instead of the diffusion layer 41. In this configuration, the polysilicon resistor 93, like the diffusion layer 41, has a spiral shape and is buried inside the trench isolator 102 so as to surround the outer periphery of the high-side-circuit region. Like the diffusion layer 41, the polysilicon resistor 93 is electrically connected to the metal wire layers 111 and 113. The configuration in FIG. 8 achieves an effect similar to that of the diffusion layer 41.

<Second Modification>

As illustrated in FIG. 2, the first embodiment describes that the polysilicon resistor 91, which is the second resistor R2, is provided so as to surround the outer periphery of the high-side-circuit region in plan view. The polysilicon resistor 91 may be in any other form. For instance, a polysilicon resistor serving as the second resistor R2 may have an accordion shape or a polygonal-line shape, and may be disposed within the low-side-circuit region in plan view.

Figure 9:
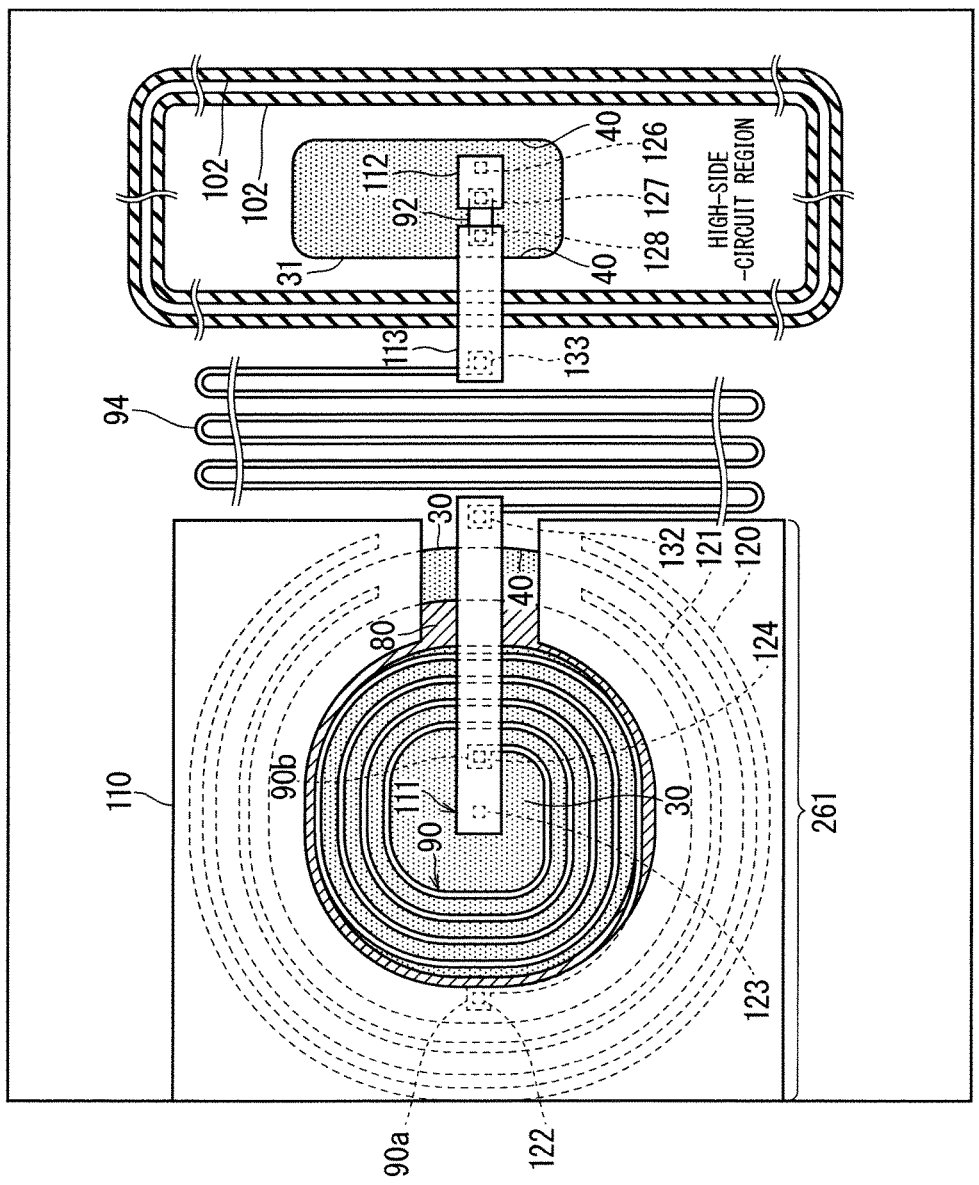
FIG. 9 is a plan view of a configuration of a dielectric-isolated driver IC according to a second modification.

FIG. 9 is a plan view of a configuration of a dielectric-isolated driver IC according to a second modification. In FIG. 9, a polysilicon resistor 94 having a vertically reciprocating accordion shape is disposed in, in plan view, a region of the low-side-circuit region, the region being located between the NMOS 261 and the high-side-circuit region. Like the polysilicon resistor 91 in FIG. 2, described in the first embodiment, the polysilicon resistor 94 is disposed in the upper part of the insulating film 101; moreover, the polysilicon resistor 94 has one end electrically connected to the metal wire layer 111 through a contact 132 in FIG. 9, and the other end electrically connected to the metal wire layer 113 through a contact 133 in FIG. 9. In such a configuration, the polysilicon resistor 94 serves as the second resistor R2.

The second modification enables the polysilicon resistor 94, serving as the second resistor R2, to be disposed in any space within the low-side-circuit region in plan view. This enables restrictions, such as disposing a certain space in the outer periphery of the high-side-circuit region, to be addressed.

Figure 10:
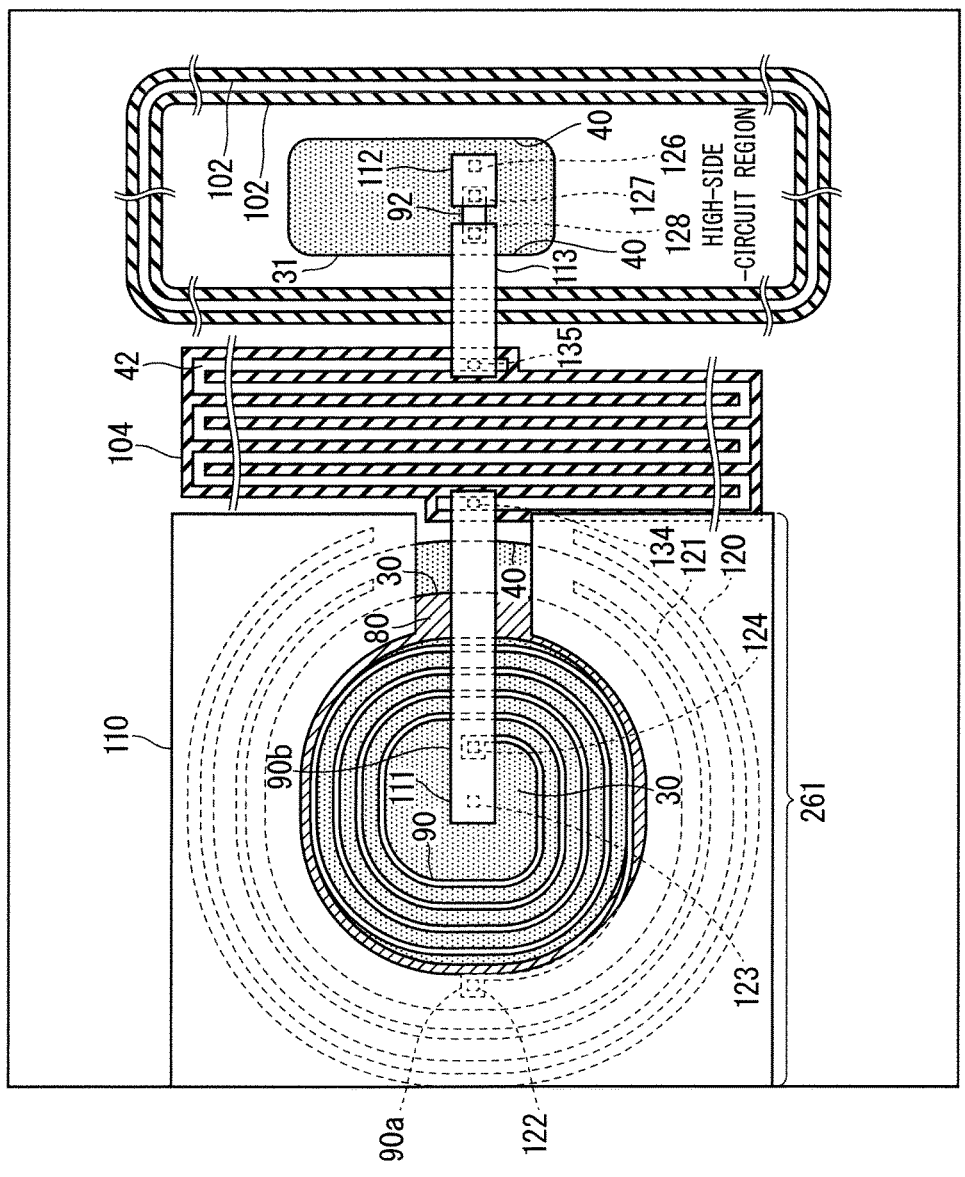
FIG. 10 is a plan view of another configuration of the dielectric-isolated driver IC according to the second modification.

It is noted that the configuration in FIG. 9 may be combined with the configuration described in the first modification. FIG. 10 is a plan view of a configuration of the dielectric-isolated driver IC in combination of the configuration in FIG. 9 and the configuration described in the first modification.

As illustrated in FIG. 10, an insulator 104 that is a second insulator such as an oxide film, is disposed in a region of the low-side-circuit region, the region being located between the NMOS 261 and the high-side-circuit region. Buried inside the insulator 104 is a diffusion layer 42 having an accordion shape. It is noted that the diffusion layer 42, although herein being a P-type diffusion layer, may be an N-type diffusion layer.

Like the diffusion layer 41, the diffusion layer 42 has one end on its low-voltage side. This one end is electrically connected to the metal wire layer 111 through a P+type diffusion layer, which is not shown, and a contact 134 in FIG. 10. Like the diffusion layer 41, the diffusion layer 42 has one end on its high-voltage side. This one end is electrically connected to the metal wire layer 113 through the P+type diffusion layer 62b, which is not shown, and a contact 135 in FIG. 10. In such a configuration, the diffusion layer 42 serves as the second resistor R2.

The configuration in FIG. 10 prevents the increase in the sizes of the circuit and the device, and enables restrictions, such as disposing a certain space in the outer periphery of the high-side-circuit region, to be addressed.

It is noted that the diffusion layer 42, although herein having an accordion shape, may have, for instance, a polygonal-line shape. It is also noted that like the first modification, a polysilicon resistor or an SOI layer instead of the diffusion layer 42 may serve as the second resistor R2.

<Third Modification>

The second modification describes that the polysilicon resistor 94, serving as the second resistor R2, is disposed within the low-side-circuit region in plan view. Such a polysilicon resistor may be in any other form. For instance, a polysilicon resistor serving as the second resistor R2 may have an accordion shape or a polygonal-line shape, and may be disposed within the high-side-circuit region in plan view.

Figure 11:
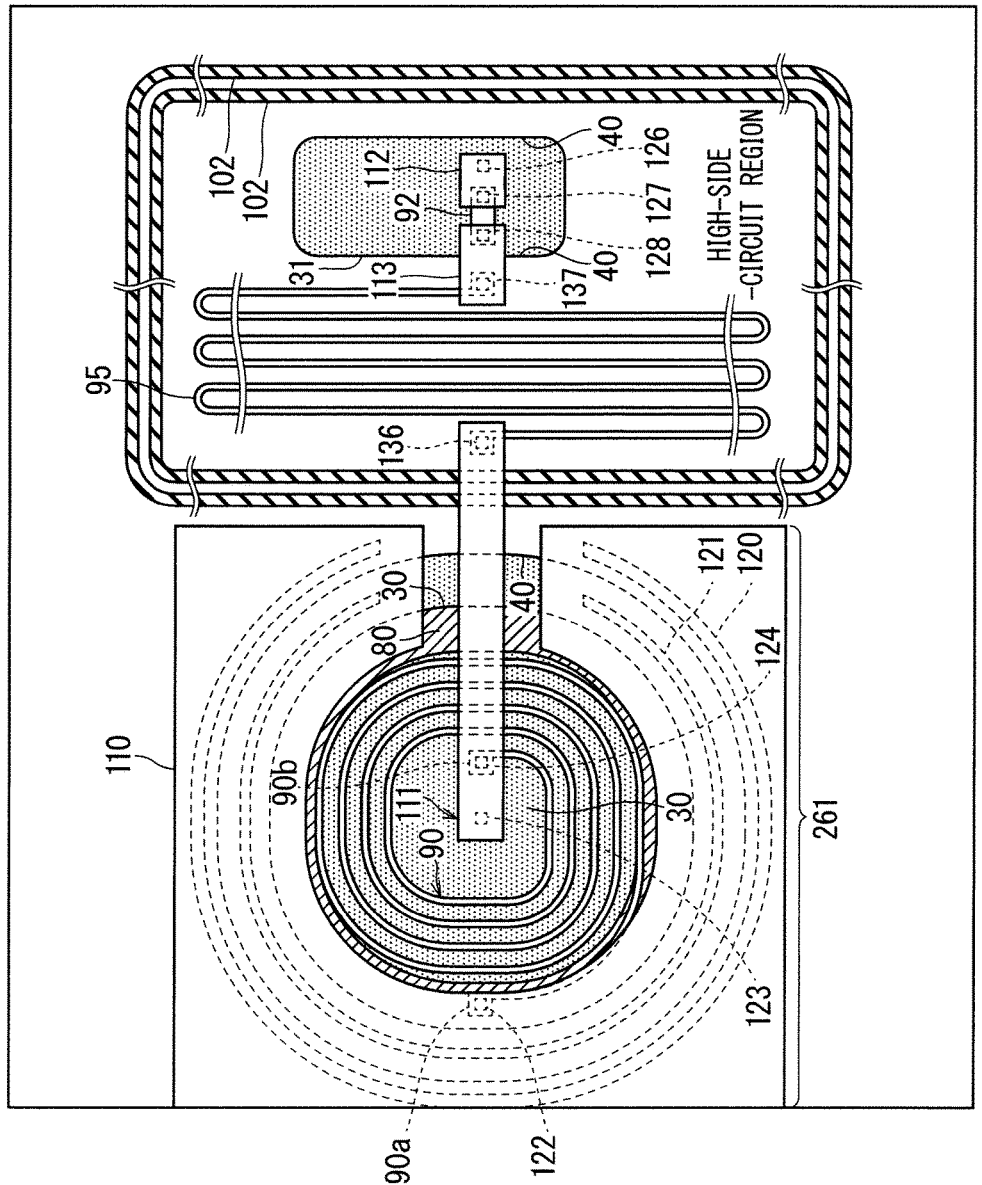
FIG. 11 is a plan view of a configuration of a dielectric-isolated driver IC according to a third modification.

FIG. 11 is a plan view of a configuration of a dielectric-isolated driver IC according to a third modification. FIG. 11 illustrates a polysilicon resistor 95 having a vertically reciprocating accordion shape, and disposed within the high-side-circuit region in plan view. Like the polysilicon resistor 91 in FIG. 2, described in the first embodiment, the polysilicon resistor 95 is disposed in the upper part of the insulating film 101; moreover, the polysilicon resistor 95 has one end electrically connected to the metal wire layer 111 through a contact 136 in FIG. 11, and the other end electrically connected to the metal wire layer 113 through a contact 137. In such a configuration, the polysilicon resistor 95 serves as the second resistor R2.

The third modification enables the polysilicon resistor 95, serving as the second resistor R2, to be disposed in any space within the high-side-circuit region in plan view. This enables restrictions, such as disposing a certain space in the outer periphery of the high-side-circuit region, to be addressed.

Figure 12:
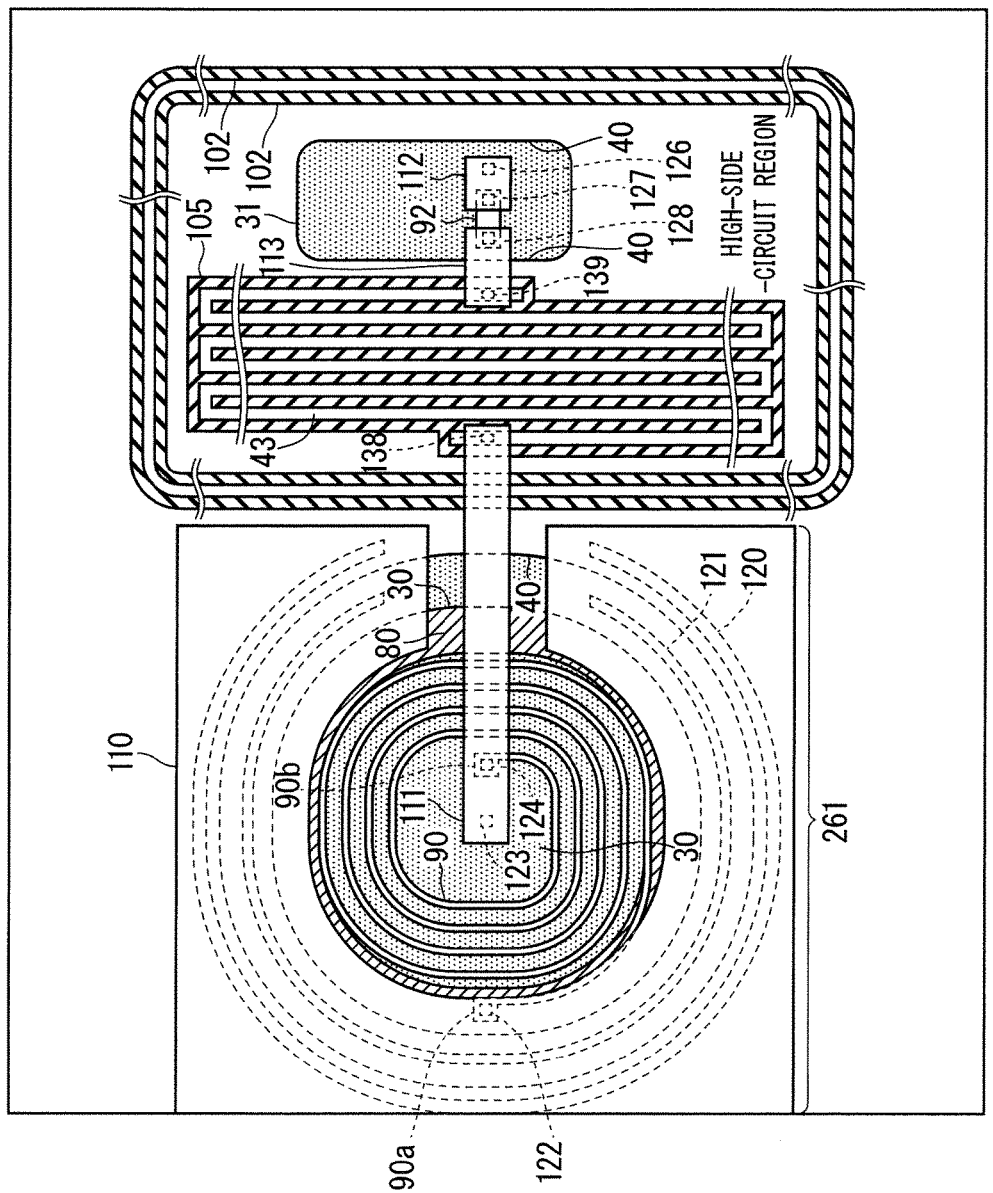
FIG. 12 is a plan view of another configuration of the dielectric-isolated driver IC according to the third modification.

It is noted that the configuration in FIG. 11 may be combined with the configuration described in the first modification. FIG. 12 is a plan view of a configuration of the dielectric-isolated driver IC in combination of the configuration in FIG. 11 and the configuration described in the first modification.

As illustrated in FIG. 12, an insulator 105 that is the second insulator such as an oxide film, is disposed within the high-side-circuit region. Buried inside the insulator 105 is a diffusion layer 43 having an accordion shape. It is noted that the diffusion layer 43, although herein being a P-type diffusion layer, may be an N-type diffusion layer.

Like the diffusion layer 41, the diffusion layer 43 has one end on its low-voltage side. This one end is electrically connected to the metal wire layer 111 through a P+type diffusion layer, which is not shown, and a contact 138 in FIG. 12. Like the diffusion layer 41, the diffusion layer 43 has one end on its high-voltage side. This one end is electrically connected to the metal wire layer 113 through the P+type diffusion layer 62b, which is not shown, and a contact 139 in FIG. 12. In such a configuration, the diffusion layer 43 serves as the second resistor R2.

The configuration in FIG. 12 prevents the increase in the sizes of the circuit and the device, and enables restrictions, such as disposing a certain space in the outer periphery of the high-side-circuit region, to be addressed.

It is noted that the diffusion layer 43, although herein having an accordion shape, may have, for instance, a polygonal-line shape. It is also noted that like the first modification, a polysilicon resistor or an SOI layer instead of the diffusion layer 43 may serve as the second resistor R2.

It is noted that in the present invention, the embodiment can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

25 SOI layer, 41, 42, 43 diffusion layer, 90, 91, 92, 93, 94, 95 polysilicon resistor, 102 trench isolator, 104, 105 insulator, 240 low-side circuit, 250 high-side circuit, 260 level shift circuit, 261 NMOS, 262 inverter, R1 first resistor, R2 second resistor, R3 third resistor, V1 power supply, V0 ground.

The invention claimed is:

1. A semiconductor circuit electrically connected between a low-side circuit and a high-side circuit whose reference voltage is higher than a reference voltage of the low-side circuit, the semiconductor circuit comprising:
  a first resistor, a second resistor, and a third resistor that are connected in series between a power supply and a ground corresponding to the reference voltage of the low-side circuit, and are arranged in this order from the power supply toward the ground;
  a MOSFET connected to the third resistor in parallel between the second resistor and the ground, and comprising a gate electrically connected to the low-side circuit; and
  an inverter electrically connected between a connection point and the high-side circuit, the connection point being positioned between the first resistor and the second resistor, wherein
  the semiconductor circuit satisfies the following expression (2) when a voltage of the power supply is a value V1, when a power supply voltage of the high-side circuit is a value V3, the power supply voltage corresponding to an absolute value of a difference between the voltage of the power supply and the reference voltage of the high-side circuit, when the first resistor has a value R1, when the second resistor has a value R2, when the third resistor has a value R3, when a combined resistance of an on-resistance of the MOSFET combined with the third resistor is a value $R_{CO}$, and when a threshold voltage of the inverter is a value Vinvth:

$$V1\text{-}V3 < V1 \times \frac{R2 + R_{CO}}{R1 + R2 + R_{CO}} < \quad (2)$$

$$Vinvth < V1 \times \frac{R2 + R3}{R1 + R2 + R3}, \text{ where}$$

$$R_{CO} = \frac{R_{ON} \times R3}{R_{ON} + R3}.$$

2. A semiconductor device comprising
  a substrate comprising a main surface on which the semiconductor circuit according to claim 1 is disposed, wherein
  a high-side-circuit region in which the high-side circuit is disposed is defined in a region on the main surface of the substrate other than a region in which the MOSFET of the semiconductor circuit is disposed, on the main surface of the substrate, a first insulator surrounding an outer periphery of the high-side-circuit region is disposed, and a drain and a source of the MOSFET of the semiconductor circuit are disposed so as to be spaced away from each other, the first resistor comprises a polysilicon resistor disposed within the high-side-circuit region in plan view, and the third resistor comprises a polysilicon resistor comprising one end connected to the drain and another end connected to the source, and having a spiral shape.

3. The semiconductor device according to claim 2, wherein the second resistor comprises a polysilicon resistor, in plan view, provided so as to surround the outer periphery of the high-side-circuit region and having a spiral shape.

4. The semiconductor device according to claim 2, wherein the substrate comprises an SOI layer comprising the main surface, and the second resistor comprises a polysilicon resistor buried inside the first insulator so as to surround the outer periphery of the high-side-circuit region, and having a spiral shape, the SOI layer having a spiral shape, or the SOI layer with an impurity diffused in a spiral shape.

5. The semiconductor device according to claim 2, wherein a low-side-circuit region in which the low-side circuit is disposed is defined in a region on the main surface of the substrate other than the high-side-circuit region, and the second resistor comprises a polysilicon resistor, in plan view, disposed within the low-side-circuit region and having an accordion shape or a polygonal-line shape.

6. The semiconductor device according to claim 2, wherein the substrate comprises an SOI layer comprising the main surface, a low-side-circuit region in which the low-side circuit and a second insulator are disposed is defined in a region on the main surface of the substrate other than the high-side-circuit region, and the second resistor comprises a polysilicon resistor buried inside the second insulator and having an accordion shape or a polygonal-line shape, the SOI layer having an accordion shape or a polygonal-line shape, or the SOI layer with an impurity diffused in an accordion shape or a polygonal-line shape.

7. The semiconductor device according to claim 2, wherein the second resistor comprises a polysilicon resistor, in plan view, disposed within the high-side-circuit region and having an accordion shape or a polygonal-line shape.

8. The semiconductor device according to claim 2, wherein the substrate comprises an SOI layer comprising the main surface, a second insulator is further disposed in the high-side-circuit region, and the second resistor comprises a polysilicon resistor buried inside the second insulator and having an accordion shape or a polygonal-line shape, the SOI layer having an accordion shape or a polygonal-line shape, or the SOI layer with an impurity diffused in an accordion shape or a polygonal-line shape.

* * * * *